(12) United States Patent
Nemoto et al.

(10) Patent No.: US 6,864,770 B2
(45) Date of Patent: Mar. 8, 2005

(54) SUPER CONDUCTIVE MAGNET APPARATUS

(75) Inventors: Takeo Nemoto, Chiyoda (JP); Hiroyuki Watanabe, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/765,166

(22) Filed: Jan. 28, 2004

(65) Prior Publication Data

US 2004/0185305 A1 Sep. 23, 2004

(30) Foreign Application Priority Data

Jan. 30, 2003 (JP) ........................................ 2003-021294

(51) Int. Cl.$^7$ .................................................. H01F 6/00
(52) U.S. Cl. ...................... 335/216; 324/319
(58) Field of Search ........................ 335/216; 62/51.1; 310/54; 505/892

(56) References Cited

U.S. PATENT DOCUMENTS

| | | |
|---|---|---|
| 3,385,072 A | 5/1968 | Marsing |
| 6,107,905 A | 8/2000 | Itoh et al. |
| 6,150,912 A * | 11/2000 | Elgin et al. ................. 335/299 |
| 6,289,681 B1 * | 9/2001 | Eckels et al. ................ 62/47.1 |
| 6,323,749 B1 | 11/2001 | Hsieh |
| 6,376,943 B1 | 4/2002 | Gamble et al. |

FOREIGN PATENT DOCUMENTS

| | | |
|---|---|---|
| EP | 0 350 267 A1 | 1/1990 |
| EP | 0 797 059 A2 | 9/1997 |
| JP | 61-027607 | 2/1986 |

\* cited by examiner

Primary Examiner—Ramon M. Barrera
(74) Attorney, Agent, or Firm—Antonelli, Terry, Stout & Kraus, LLP

(57) ABSTRACT

In a super conductive magnet apparatus comprising a super conductive coil, a helium containing volume for containing therein liquid helium to keep a temperature of the super conductive coil low, and a vacuum vessel containing therein the super conductive coil and the helium containing volume, the super conductive magnet apparatus further comprises a support body on which the super conductive coil is arranged, a container cover forming the helium containing volume with the support body in such a manner that a thermal energy is capable of being transmitted between the super conductive coil and the liquid helium, and a connecting member connecting the support body to the vacuum vessel so that the support body is supported through the connecting member on the vacuum vessel.

20 Claims, 6 Drawing Sheets

SUPER CONDUCTIVE MAGNET APPARATUS

BACKGROUND OF THE INVENTION

The present invention relates to a super conductive magnet apparatus, and a magnetic resonance imaging machine including the super conductive magnet apparatus.

In a prior art super conductive magnet apparatus disclosed by JP-A-10-4009, a super conductive magnet is contained by a container while a space between the super conductive magnet and the container is filled with a liquid helium, and the container is supported on a vessel through connecting members.

In a prior art super conductive magnet apparatus disclosed by JP-A-2001-77434, a super conductive magnet is supported on a vessel through connecting members, and is cooled by a liquid helium through a thermally conductive plate.

BRIEF SUMMARY OF THE INVENTION

An object of the present invention is to provide a super conductive magnet apparatus, and a magnetic resonance imaging machine including the super conductive magnet apparatus, in which apparatus a super conductive magnet is effectively cooled by a liquid helium, and/or a thermal energy is restrained from being applied to the super conductive magnet from an outer environment of the super conductive magnet apparatus.

According to the present invention, since in a super conductive magnet apparatus comprising, a super conductive coil, a helium containing volume or vessel for containing therein liquid helium to keep a temperature of the super conductive coil low, and a vacuum vessel containing therein the super conductive coil and the helium containing volume, the super conductive magnet apparatus further comprises a support body on which the super conductive coil is arranged, a container cover forming the helium containing volume with the support body in such a manner that a thermal energy is capable of being transmitted between the super conductive coil and the liquid helium, and a connecting member connecting the support body to the vacuum vessel so that the support body is supported through the connecting member on the vacuum vessel, the connecting member (preferably having at least partially a bar-shape) restrains effectively the thermal transmission between the support body and the outer environment of the super conductive magnet apparatus.

If the super conductive coil is capable of generating a magnetic force in such a manner that a tensile stress is generated longitudinally in the connecting member by the magnetic force while the super conductive coil is prevented from generating the magnetic force in such a manner that a compressive stress is generated longitudinally in the connecting member by the magnetic force, a cross sectional area of the connecting member may be minimized, because the connecting member does not need to have a strength and/or rigidity against a compression buckling thereof.

If the connecting member extends through the liquid helium in the containing volume, and/or the connecting member extends through the container cover to the vacuum vessel, the connecting member is effectively cooled by the liquid helium or the thermal energy supplied from the outer environment to the connecting member is effectively absorbed by the liquid helium, so that the super conductive magnet is effectively cooled by the liquid helium, and/or the thermal energy is restrained from being applied to the super conductive magnet through the connecting member from the outer environment of the super conductive magnet apparatus. If the connecting member includes a monolithic part thereof extending through the container cover from an inner side of the container cover contacting the liquid helium to a vacuum outer side of the container cover, a hermetic sealing between the monolithic part of the connecting member and the container cover can be securely maintained, and a contact area between the monolithic part of the connecting member and the container cover can be minimized.

When the thermal energy is capable of being transmitted through the support body between the super conductive coil and the liquid helium while the liquid helium is prevented from contacting the super conductive coil, the hermetic sealing of the liquid helium is easily maintained, because an electric power supply to the super conductive coil does not need to extend through the container cover. When the thermal energy is capable of being transmitted between the super conductive coil and the liquid helium contacting the super conductive coil, the super conductive coil can be effectively cooled by a direct contact between the super conductive coil and the liquid helium.

The super conductive coil may be wound on the support body. The super conductive magnet apparatus may further comprises a shield surrounding the super conductive coil and the helium containing volume, and surrounded by the vacuum vessel. The shield may include one of aluminum and austenitic stainless steel as a main component thereof.

The super conductive magnet apparatus may comprise a pair of the super conductive coils one of which super conductive coils is surrounded by the other one of the super conductive coils as seen in a common axial direction of the super conductive coils. If the connecting member extends between the super conductive coils as seen in the common axial direction of the super conductive coils, a bending or rotational moment is restrained from being generated by the magnetic forces of the super conductive coils, particularly when directions of the magnetic forces of the super conductive coils are equal to each other. If the super conductive coils overlap each other at least partially as seen in a transverse direction perpendicular to the common axial direction, it is preferable for easily forming the support body with both super conductive coils wound thereon that the support body includes first and second support body parts on which the super conductive coils are respectively wound, and the first and second support body parts are discrete from each other to be separable from each other. If the first and second support body parts have respective surfaces facing to each other in a transverse direction perpendicular to the common axial direction in such a manner that the first and second support body parts are capable of being positioned with respect to each other in the transverse direction by a contact between the surfaces, the first and second support body parts can be positioned correctly with respect to each other in the transverse direction. If the first and second support body parts are separable from each other along and/or from at least one face extending in a transverse direction perpendicular to the common axial direction, the first and second support body parts can be positioned correctly with respect to each other in the common axial direction.

If a part of the connecting member extending through the liquid helium includes austenitic stainless steel as a main component thereof, a magnetic field of the super conductive coil is restrained from being deteriorated by the connecting member.

If the support body has a fluidal path fluidly communicating with the helium containing volume and covered by a part the connecting member so that the part the connecting member is fluidly communicating with the helium containing volume, the thermal energy supplied from the outer environment to the connecting member is effectively absorbed by the liquid helium, and/or the thermal energy is restrained from being applied to the super conductive magnet through the connecting member from the outer environment of the super conductive magnet apparatus, even when the connecting member is prevented from extending through the liquid helium and/or the container cover.

If the support body includes austenitic stainless steel as a main component thereof, the magnetic field of the super conductive coil is restrained from being deteriorated by the support body. A magnetic resonance imaging machine may comprises the super conductive magnet apparatus according to the present invention.

Other objects, features and advantages of the invention will become apparent from the following description of the embodiments of the invention taken in conjunction with the accompanying drawings.

DETAILED DESCRIPTION OF THE INVENTION

Figure 1:
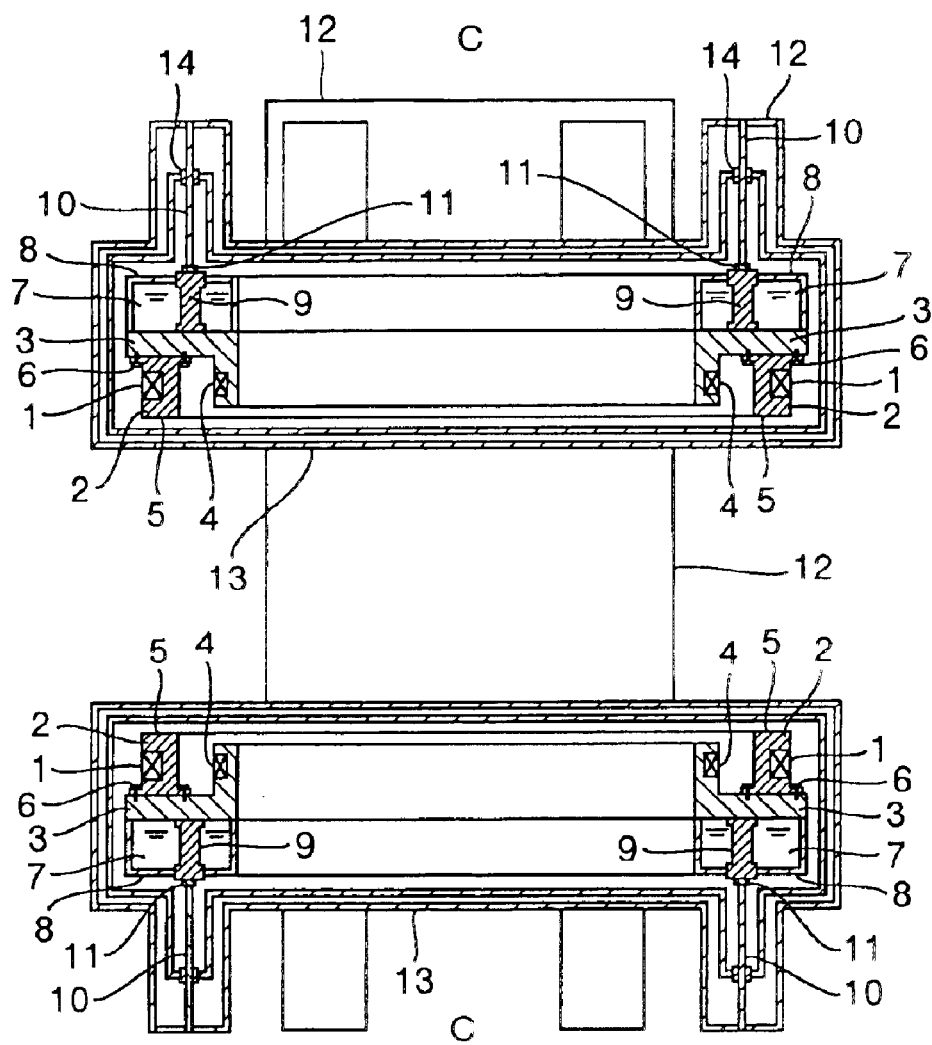
FIG. 1 is a partially cross-sectional view showing a super conductive magnet apparatus usable for a magnetic resonance imaging machine.

In FIG. 1, main coils 1 of a super conductive magnet are wound on respective coil frames 2. Support bodies 3 are formed of (preferably austenitic) stainless steel or aluminum alloy, and include respective coil frames 2 of respective sub-coils 4 of the super conductive magnet surrounded respectively by the main coils 1 coaxially. Two pairs of the main coils 1 and coil frames 2 are stacked vertically to form a space therebetween in such a manner that a patient can be inserted in the space in which a high and constant density magnetic field is generated by the super conductive magnet. The coil frames 2 of the main coils 1 are detachably mounted with binders 5 and bolts 6 onto the support bodies 3 forming the coil frames of the sub-coils 4. Volume 7 formed by the support bodies 3 and covers 8 are filled with a liquid helium to cool the main coils 1 and sub-coils 4.

Figure 2:
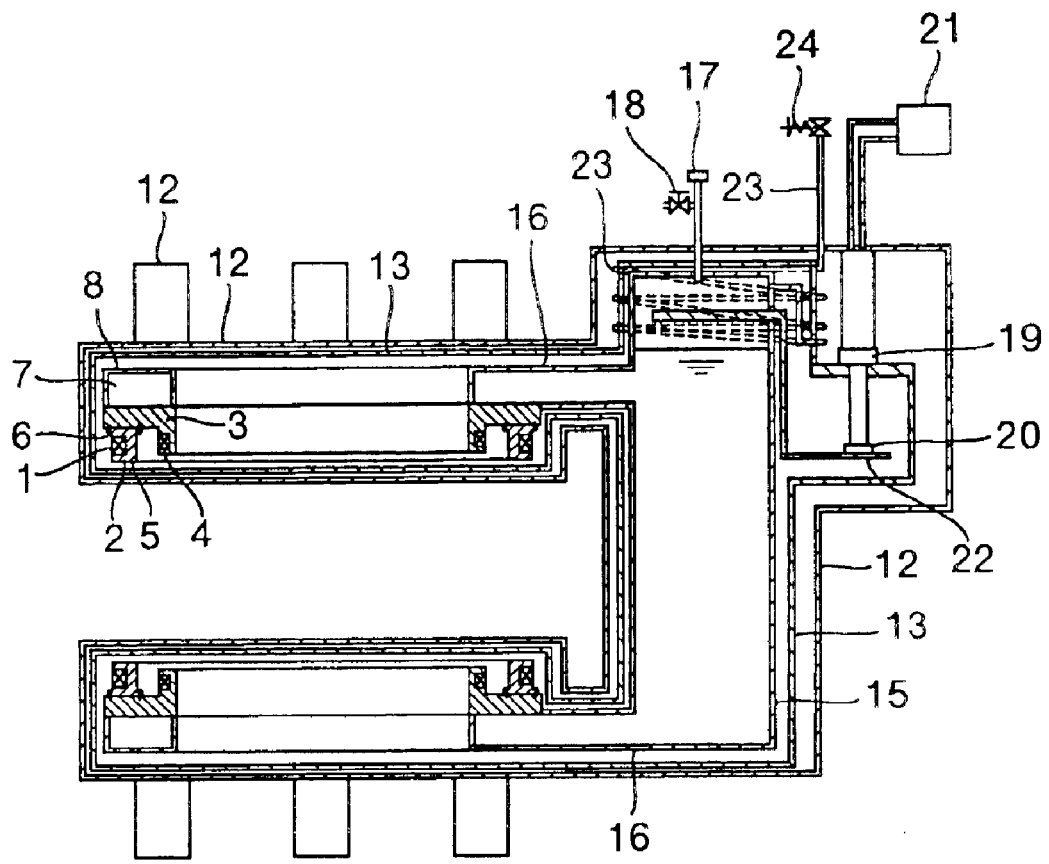
FIG. 2 is another partially cross-sectional view showing the super conductive magnet apparatus.

In FIGS. 1 and 2, each of the support bodies 3 is supported on a vacuum vessel 12 through twelve connecting members including respective support members 9 (preferably made of austenitic stainless steel) in liquid and low temperature support elements 10 (preferably made of austenitic stainless steel or a plastic reinforced by glass fiber). Ends of the support members 9 are connected to the support bodies 3 and the other ends thereof are connected to the covers 8 by welding. Ends of the low temperature support elements 10 are connected to the other ends of the support members 9 through mounting members 11, and the other ends of the low temperature support elements 10 are connected to the vacuum vessel 12. A shield 13 surrounds the covers 8, support members 9, support bodies 3, main coils 1, sub-coils 4, and parts of the low temperature support elements 10, and is formed of a low thermal radiation characteristic material, such as aluminum or the like.

The shield 13 may be covered by a thermal insulator sheet (not shown) formed of stacked films on whose outer surfaces aluminum is deposited to restrain a radiant energy from being transmitted into the thermal insulator sheet. The low temperature support elements 10 are connected to the shield 13 through thermal anchors 14 for keeping a high thermal transmission therebetween so that a temperature of the low temperature support elements 10 is kept low to restrain a thermal transmission between the low temperature support elements 10 and the liquid helium.

Figure 3:
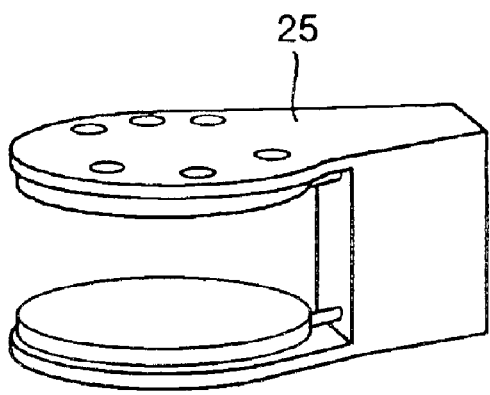
FIG. 3 is an oblique projection view of the super conductive magnet apparatus with a magnetic shield.

As shown in FIG. 3, magnetic shields 25 including a magnetically permeable material may be arranged respectively on upper and lower sides of the vacuum vessel 12 to cover the coils so that a magnetic flux from is prevented leaking from the super conductive magnet to an undesired area.

A deformation v of the support bodies 3 may calculated from Young's modulus E, bearing load per unit length ω, distance between adjacent connecting members L and geometrical moment of inertia I of the support bodies 3 along the following formula.

$$v=(5\omega L^4)/384EI$$

Therefore, it is effective for decreasing the deformation v while keeping a thickness of the support bodies 3 low for keeping a thermal conductivity between the coils and the liquid helium high that a number of the connecting members is increased as great as possible.

It is effective for increasing a thermal conductivity between the support bodies 3 and the coil frames 2 of the main coils 1 to decrease a cooling time of the coils and effectively cool the coils that a contact pressure is made as great as possible and/or a high thermal conductivity element such as a high thermal conductivity sheet or grease is arranged therebetween.

When the main coils 1 or sub-coils 4 are deleted, the detachable coil frame for main coils 1 or sub-coils 4 may be deleted, and the support bodies 3 may have support body parts on which the coils are not wound and coil frames on which the coils are wound while the support body parts are separable from the coil frames.

As shown in FIG. 2, a reservoir 15 stores the liquid helium, and a connecting pipe 16 connects fluidly the reservoir 15 to the volume 7 formed by the support bodies 3 and covers 8. An injection port 17 allows the liquid helium to be supplied into the reservoir 15, and a discharge valve 18 allows the helium to be discharged to the atmosphere.

A helium refrigerating machine has a high temperature stage 19 having refrigerating capacity of 70 W at about 70 Kelvin and a low temperature stage 20 having refrigerating capacity of 1 W at about 4 Kelvin. A heat exchanger 22 cooled by the low temperature stage 20 absorbs a heat energy from a helium gas in the reservoir 15 to liquefy the helium. The high temperature stage 19 absorbs a heat energy from the shield 13 to be cooled.

A gas pipe 23 extends from an upper region of the reservoir 15 to the atmosphere outside of the vacuum vessel 12 with a thermal contact with the shield 13 surrounding the reservoir 15 so that an evaporation of the liquid helium in the gas pipe 23 extending to the atmosphere cools the shield 13 when the helium refrigerating machine is stopped. A check valve 24 prevents the atmosphere from flowing into the reservoir 15 when the helium refrigerating machine is operated to decrease a pressure in the reservoir 15.

The liquid helium cooled and liquefied in the reservoir 15 is evaporated by the support bodies 3, main coils 1 and/or sub-coils 4 so that temperatures of the main coils 1 and sub-coils 4 are kept less than critical temperatures thereof to operate the main coils 1 and sub-coils 4 stably. The evaporated helium is again cooled and liquefied in the reservoir 15 so that the helium does not need to be supplied into the reservoir 15. The shield 13 cooled at 40–80 Kelvin by the high temperature stage 19 decreases a thermal conduction between the connecting members and the liquid helium.

Figure 4:
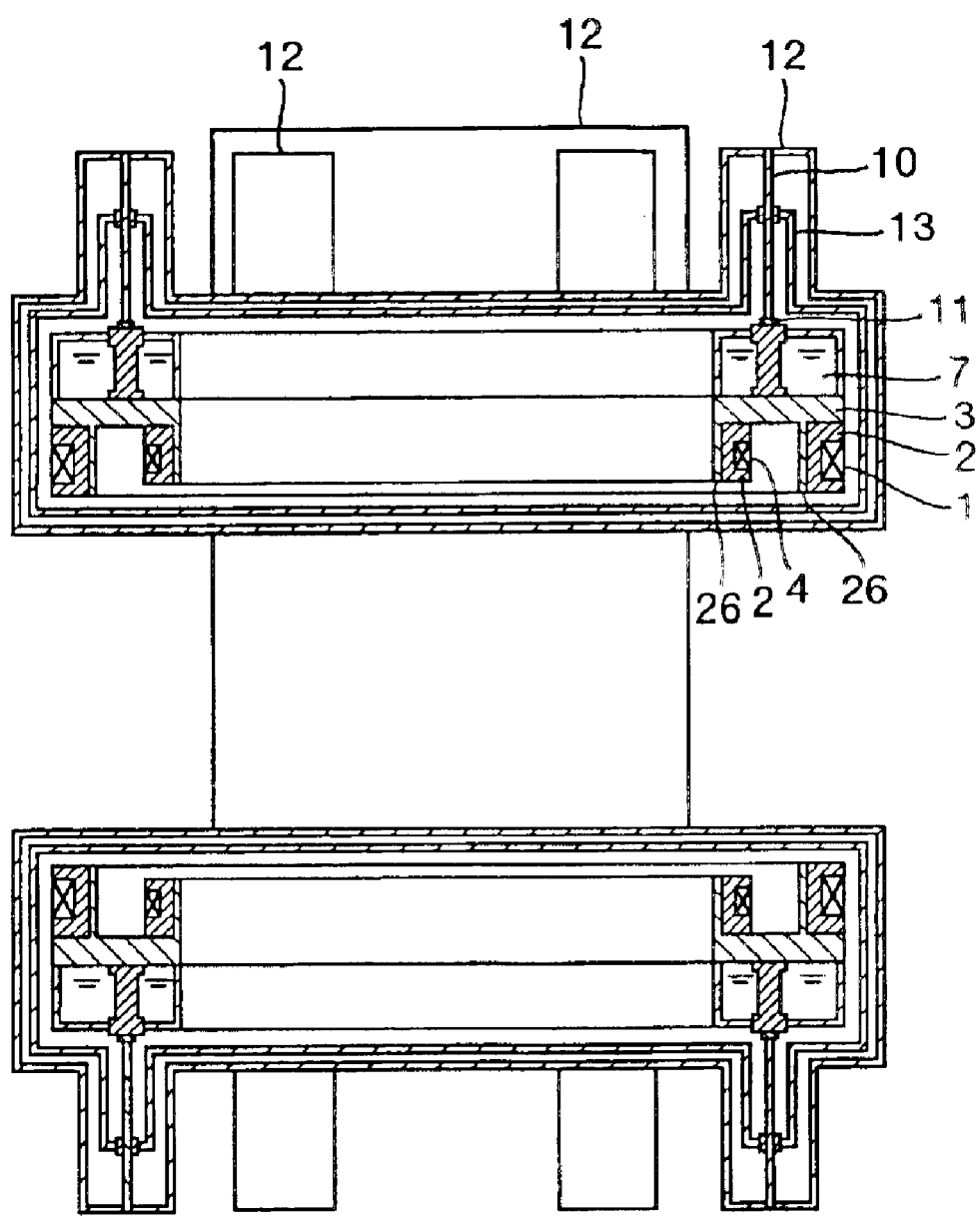
FIG. 4 is a partially cross-sectional view showing another super conductive magnet apparatus usable for the magnetic resonance imaging machine.
Figure 5:
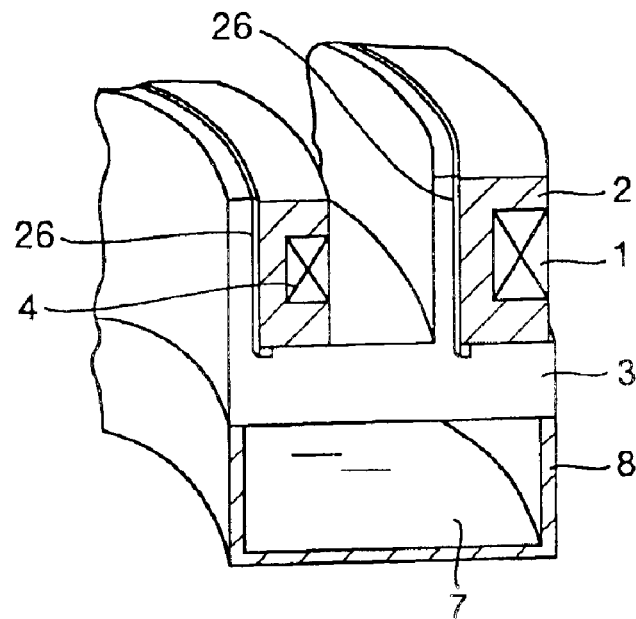
FIG. 5 is a partially cross-sectional view showing a connecting structure between a coil frame and a support body.
Figure 6:
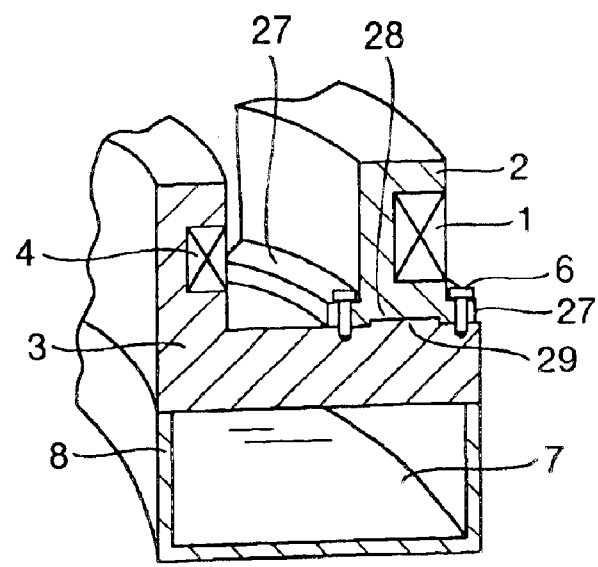
FIG. 6 is a partially cross-sectional view showing another connecting structure between the coil frame and the support body.

As shown in FIGS. 4 and 5, the coil frames of the main coils 1 and sub-coils 4 may be joined with the support bodies 3 through screw engagements 26. As shown in FIG. 6, a pair of the support body 3 and the coil frame 2 may have recess and protrusion engagement between the support body 3 and coil frame 2 so that the support body 3 and coil frame 2 are positioned correctly with respect to each other, and a contact area for thermal conductivity therebetween is increased.

Figure 7:
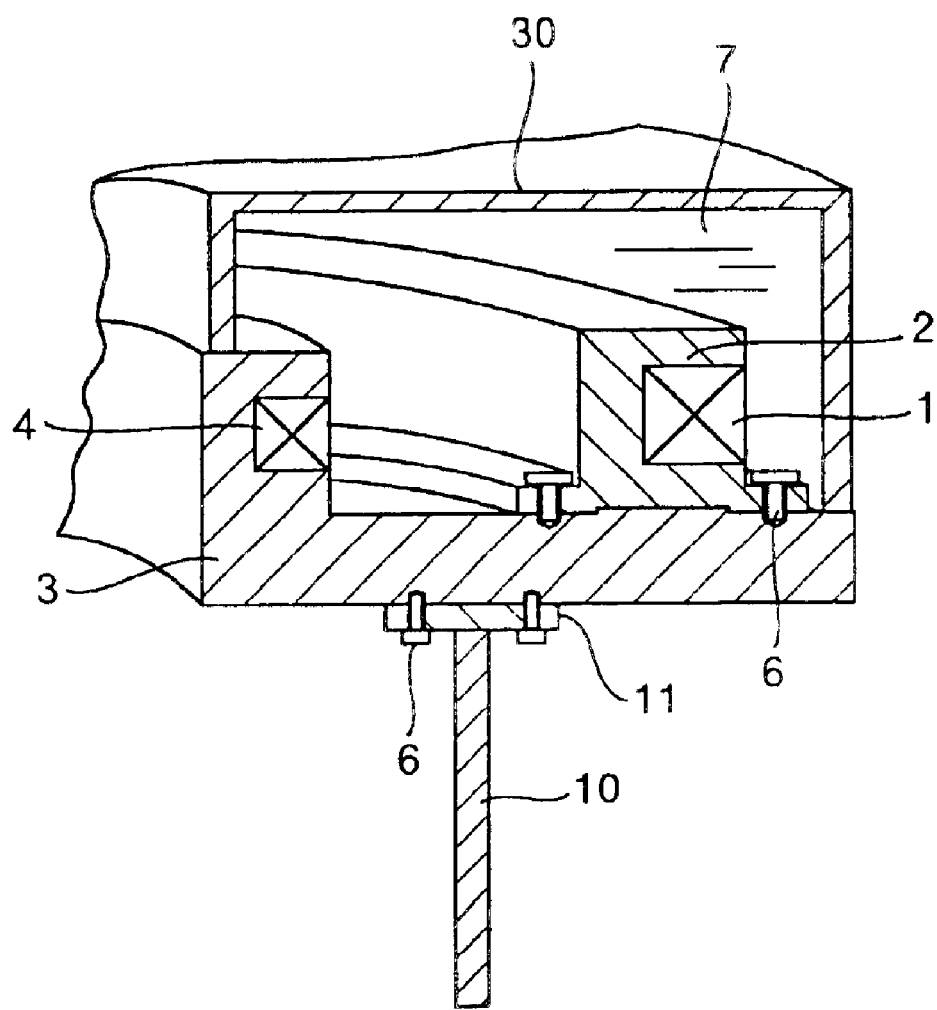
FIG. 7 is a partially cross-sectional view showing another connecting structure between the coil frame and the support body.
Figure 8:
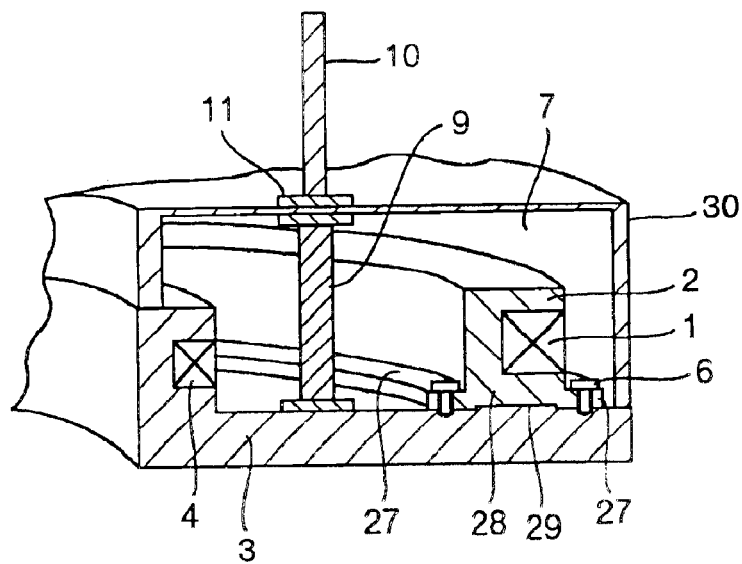
FIG. 8 is a partially cross-sectional view showing another connecting structure between the coil frame and the support body.
Figure 9:
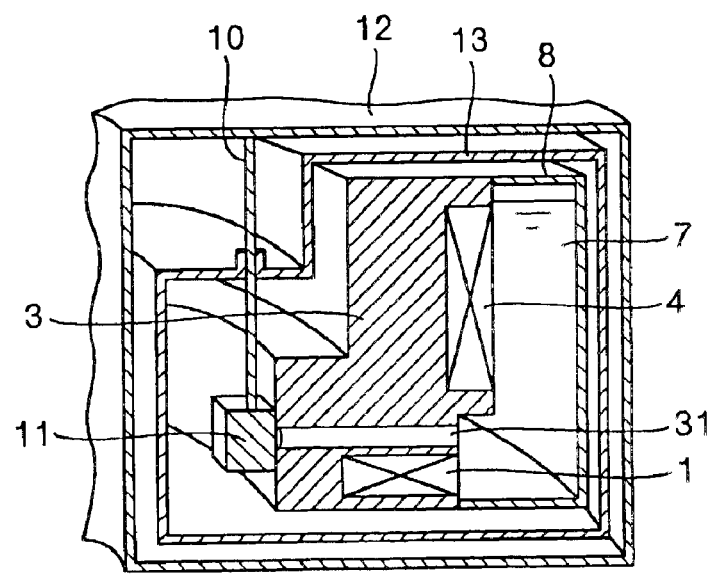
FIG. 9 is a partially cross-sectional view showing another connecting structure between the coil frame and the support body.

As shown in FIGS. 7–10, the main coils 1 and sub-coils 4 may contact the liquid helium. As shown in FIG. 7, the low temperature support elements 10 are fixed to the support bodies 3 through attachments 11 fixed to the support bodies 3 by bolts. As shown in FIG. 8, the support members 9 may extend through the volume in which the main coils 1 and sub-coils 4 contact the liquid helium.

If the connecting members extending between the support bodies 3 and the vacuum vessel is prevented from extending through the liquid helium, it is preferable for keeping the temperature of the connecting members low to restrain the thermal conduction between the connecting members and the main coils 1 and sub-coils 4 that the connecting members or attachments 11 may contact the liquid helium through liquid helium passages 31 extending through the support bodies 3.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A super conductive magnet apparatus comprising,
    a super conductive coil,
    a helium containing volume for containing therein liquid helium to keep a temperature of the super conductive coil low, and
    a vacuum vessel containing therein the super conductive coil and the helium containing volume,
    wherein the super conductive magnet apparatus further comprises a support body on which the super conductive coil is arranged, a container cover forming the helium containing volume with the support body in such a manner that a thermal energy is capable of being transmitted between the super conductive coil and the liquid helium, and a connecting member connecting the support body to the vacuum vessel so that the support body is supported through the connecting member on the vacuum vessel.

2. A super conductive magnet apparatus according to claim 1, wherein the super conductive coil is capable of generating a magnetic force in such a manner that a tensile stress is generated longitudinally in the connecting member by the magnetic force.

3. A super conductive magnet apparatus according to claim 1, wherein the connecting member extends through the liquid helium in the containing volume.

4. A super conductive magnet apparatus according to claim 1, wherein the connecting member extends through the container cover to the vacuum vessel.

5. A super conductive magnet apparatus according to claim 4, wherein the connecting member includes a monolithic part thereof extending between inside and outside of the container cover.

6. A super conductive magnet apparatus according to claim 1, wherein the thermal energy is capable of being transmitted through the support body between the super conductive coil and the liquid helium while the liquid helium is prevented from contacting the super conductive coil.

7. A super conductive magnet apparatus according to claim 1, wherein the thermal energy is capable of being transmitted between the super conductive coil and the liquid helium contacting the super conductive coil.

8. A super conductive magnet apparatus according to claim 1, wherein the super conductive coil is wound on the support body.

9. A super conductive magnet apparatus according to claim 1, further comprising a shield surrounding the super conductive coil and the helium containing volume, and surrounded by the vacuum vessel.

10. A super conductive magnet apparatus according to claim 9, wherein the shield includes one of aluminum and austenitic stainless steel as a main component thereof.

11. A super conductive magnet apparatus according to claim 1, wherein the super conductive magnet apparatus comprises a pair of the super conductive coils one of which super conductive coils is surrounded by the other one of the super conductive coils as seen in a common axial direction of the super conductive coils.

12. A super conductive magnet apparatus according to claim 11, wherein the connecting member extends between the super conductive coils as seen in the common axial direction of the super conductive coils.

13. A super conductive magnet apparatus according to claim 11, wherein the super conductive coils overlap each other at least partially as seen in a transverse direction perpendicular to the common axial direction.

14. A super conductive magnet apparatus according to claim 11, wherein the support body includes first and second support body parts on which the super conductive coils are respectively wound, and the first and second support body parts are discrete from each other to be separable from each other.

15. A super conductive magnet apparatus according to claim 14, wherein the first and second support body parts have respective surfaces facing to each other in a transverse direction perpendicular to the common axial direction in such a manner that the first and second support body parts are capable of being positioned with respect to each other in the transverse direction by a contact between the surfaces.

16. A super conductive magnet apparatus according to claim 14, wherein the first and second support body parts are separable from each other along at least one face extending in a transverse direction perpendicular to the common axial direction.

17. A super conductive magnet apparatus according to claim 3, wherein a part of the connecting member extending through the liquid helium includes austenitic stainless steel as a main component thereof.

18. A super conductive magnet apparatus according to claim 1, wherein the support body has a fluidal path fluidly communicating with the helium containing volume and covered by a part of the connecting member so that the part the connecting member is fluidly communicating with the helium containing volume.

19. A super conductive magnet apparatus according to claim 1, wherein the support body includes austenitic stainless steel as a main component thereof.

20. A magnetic resonance imaging machine comprising the super conductive magnet apparatus according to claim 1.

* * * * *